(12) United States Patent
Shah et al.

(10) Patent No.: US 10,106,883 B2
(45) Date of Patent: Oct. 23, 2018

(54) SPUTTERING SYSTEM AND METHOD USING DIRECTION-DEPENDENT SCAN SPEED OR POWER

(71) Applicant: Intevac, Inc., Santa Clara, CA (US)

(72) Inventors: Vinay Shah, San Mateo, CA (US); Alexandru Riposan, Palo Alto, CA (US); Terry Bluck, Santa Clara, CA (US); Vladimir Kudriavtsev, Palo Alto, CA (US)

(73) Assignee: INTEVAC, INC., Santa Clara, CA (US)

( * ) Notice: Subject to any disclaimer, the term of this patent is extended or adjusted under 35 U.S.C. 154(b) by 821 days.

(21) Appl. No.: 14/185,859

(22) Filed: Feb. 20, 2014

(65) Prior Publication Data

US 2014/0311893 A1  Oct. 23, 2014

Related U.S. Application Data

(63) Continuation-in-part of application No. 13/667,976, filed on Nov. 2, 2012, now abandoned.
(Continued)

(51) Int. Cl.
*C23C 14/34* (2006.01)
*C23C 14/35* (2006.01)
(Continued)

(52) U.S. Cl.
CPC .............. *C23C 14/35* (2013.01); *C23C 14/56* (2013.01); *H01J 37/32669* (2013.01);
(Continued)

(58) Field of Classification Search
CPC ..................... H01J 37/32669; H01J 37/3455
See application file for complete search history.

(56) References Cited

U.S. PATENT DOCUMENTS 4,182,980 A   1/1980   Tholome
5,827,409 A   10/1998  Iwata et al.
(Continued)

FOREIGN PATENT DOCUMENTS

CN    1188816 A       7/1998
CN    101988189 A     3/2011
(Continued)

OTHER PUBLICATIONS

Restriction Requirement in U.S. Appl. No. 13/667,976 dated Sep. 10, 2014.
(Continued)

*Primary Examiner* — Jason Berman
(74) *Attorney, Agent, or Firm* — Womble Bond Dickinson (US) LLP; Joseph Bach, Esq.

(57) ABSTRACT

A sputtering system having a processing chamber with an inlet port and an outlet port, and a sputtering target positioned on a wall of the processing chamber. A movable magnet arrangement is positioned behind the sputtering target and reciprocally slides behind the target. A conveyor continuously transports substrates at a constant speed past the sputtering target, such that at any given time, several substrates face the target between the leading edge and the trailing edge. In certain embodiments, the movable magnet arrangement slides at a speed that is at least several times faster than the constant speed of the conveyor. A rotating zone is defined behind the leading edge and trailing edge of the target, wherein the magnet arrangement decelerates when it enters the rotating zone and accelerates as it reverses direction of sliding within the rotating zone. In certain embodiments, magnet power and/or speed varies as function of direction of magnet travel.

13 Claims, 9 Drawing Sheets

Related U.S. Application Data

(60) Provisional application No. 61/556,154, filed on Nov. 4, 2011.

(51) Int. Cl.
*H01J 37/34* (2006.01)
*H01J 37/32* (2006.01)
*C23C 14/56* (2006.01)

(52) U.S. Cl.
CPC .. *H01J 37/32779* (2013.01); *H01J 37/32899* (2013.01); *H01J 37/3405* (2013.01); *H01J 37/3417* (2013.01); *H01J 37/3452* (2013.01); *H01J 37/3455* (2013.01)

(56) References Cited

U.S. PATENT DOCUMENTS

| | | | |
|---|---|---|---|
| 5,833,815 A | 11/1998 | Kim et al. | |
| 5,873,989 A | 2/1999 | Hughes et al. | |
| 6,183,615 B1 * | 2/2001 | Yasar | H01L 21/67709 204/192.12 |
| 6,306,267 B1 | 10/2001 | Tamura et al. | |
| 6,413,392 B1 | 7/2002 | Sahoda et al. | |
| 6,464,841 B1 | 10/2002 | Hurwitt | |
| 6,485,616 B1 * | 11/2002 | Howard | C23C 14/505 118/728 |
| 6,956,223 B2 | 10/2005 | Smick et al. | |
| 7,744,731 B2 | 6/2010 | Sasaki | |
| 8,133,368 B2 | 3/2012 | Hawrylchak et al. | |
| 2003/0146087 A1 | 8/2003 | Teng et al. | |
| 2003/0228238 A1 | 12/2003 | Zhang et al. | |
| 2003/0230482 A1 | 12/2003 | Teng et al. | |
| 2004/0050690 A1 * | 3/2004 | Green | H01J 37/3455 204/192.13 |
| 2004/0154914 A1 | 8/2004 | Cho et al. | |
| 2005/0061666 A1 | 3/2005 | Gupta et al. | |
| 2005/0099616 A1 | 5/2005 | Loopstra et al. | |
| 2005/0145478 A1 | 7/2005 | Tepman | |
| 2006/0272935 A1 | 12/2006 | Le et al. | |
| 2007/0012562 A1 | 1/2007 | Le et al. | |
| 2008/0083610 A1 | 4/2008 | Tang et al. | |
| 2008/0202924 A1 | 8/2008 | Bluck et al. | |
| 2008/0230372 A1 | 9/2008 | Cousins et al. | |
| 2009/0127098 A1 | 5/2009 | Sasaki | |
| 2009/0139854 A1 | 6/2009 | Chang et al. | |
| 2010/0006424 A1 | 1/2010 | Chung et al. | |
| 2010/0078309 A1 | 4/2010 | Ueda et al. | |
| 2010/0294649 A1 * | 11/2010 | Nakamura | C23C 14/352 204/192.12 |
| 2010/0300876 A1 | 12/2010 | Hou et al. | |
| 2011/0031116 A1 | 2/2011 | Pei | |
| 2011/0220494 A1 | 9/2011 | Ding | |
| 2011/0233058 A1 | 9/2011 | Liu | |
| 2011/0266141 A1 | 11/2011 | Drayton et al. | |
| 2013/0112546 A1 | 5/2013 | Brown et al. | |
| 2013/0213797 A1 | 8/2013 | Lin et al. | |
| 2013/0319855 A1 | 12/2013 | Li | |
| 2014/0042023 A1 | 2/2014 | Ritchie et al. | |
| 2014/0332376 A1 | 11/2014 | Shah et al. | |
| 2015/0235824 A1 | 8/2015 | Brown et al. | |
| 2016/0177438 A1 | 6/2016 | Shah et al. | |
| 2016/0268110 A1 | 9/2016 | Brown et al. | |

FOREIGN PATENT DOCUMENTS

| | | | |
|---|---|---|---|
| CN | 101570274 B | 4/2011 | |
| CN | 104114741 A | 10/2014 | |
| CN | 104114741 B | 6/2016 | |
| CN | 105908145 A | 8/2016 | |
| DE | 197 01 575 A1 | 7/1998 | |
| DE | 112015000895 T5 | 11/2016 | |
| EP | 0503138 A1 | 9/1992 | |
| EP | 2 773 792 | 9/2014 | |
| JP | 07-18435 A | 1/1995 | |
| JP | 09-59772 A | 3/1997 | |
| JP | 09-111453 A | 4/1997 | |
| JP | 10-219443 A | 8/1998 | |
| JP | 2000-192239 A | 7/2000 | |
| JP | 2000-345335 A | 12/2000 | |
| JP | 2005-232593 A | 9/2005 | |
| JP | 2007-238978 A | 9/2007 | |
| JP | WO 2009093598 A1 * | 7/2009 | ........... C23C 14/352 |
| JP | 2010-522274 A | 7/2010 | |
| JP | 2014532813 A | 12/2014 | |
| KR | 10-2014-0116067 | 10/2014 | |
| KR | 10-2016-0124809 A | 10/2016 | |
| TW | 390913 B | 5/2000 | |
| TW | 493011 B | 7/2002 | |
| TW | 572041 B | 1/2004 | |
| TW | 200538569 A | 12/2005 | |
| TW | 201137145 A1 | 11/2011 | |
| TW | I403603 B | 8/2013 | |
| TW | I409353 B1 | 9/2013 | |
| TW | I426144 B | 2/2014 | |
| TW | I473900 B | 2/2015 | |
| TW | 201540859 A | 11/2015 | |
| TW | 201542850 A | 11/2015 | |
| TW | 201546308 A | 12/2015 | |
| TW | I519665 B | 2/2016 | |
| WO | 2006113170 A2 | 10/2006 | |
| WO | 2008/115325 A1 | 9/2008 | |
| WO | 2011/058812 A1 | 5/2011 | |
| WO | 2013/109333 A2 | 7/2013 | |
| WO | 2015/127074 A1 | 8/2015 | |
| WO | 2015/127141 A1 | 8/2015 | |
| WO | 2015/130532 A1 | 9/2015 | |

OTHER PUBLICATIONS

Office Action in U.S. Appl. No. 13/667,976 dated Dec. 18, 2014.
International Search Report and Written Opinion in PCT Application No. PCT/US2012/063432, dated Jul. 1, 2013.
International Preliminary Report on Patentability in PCT Application No. PCT/US2012/063432, dated May 15, 2014.
Extended European Search Report in European Patent Application No. 12866275.6 dated Mar. 20, 2015.
Notice of Allowance and Search Report in Taiwanese Patent Application No. 101140693 dated Nov. 4, 2014.
Office Action in U.S. Appl. No. 13/667,976 dated Aug. 10, 2015.
International Search Report and Written Opinion for PCT Application No. PCT/US2015/016448 dated Jun. 8, 2015.
Office Action in U.S. Appl. No. 14/185,867 dated Jul. 2, 2015.
International Search Report and Written Opinion for PCT Application No. PCT/US2015/016611 dated May 20, 2015.
International Search Report and Written Opinion for PCT Application No. PCT/US2015/016712 dated May 18, 2015.
Office Action in Taiwanese Patent Application No. 104105774 dated Oct. 23, 2015.
Office Action in Chinese Patent Application No. 201280059621.6 dated Jul. 24, 2015.
Notice of Allowance in Taiwanese Patent Application No. 104105772 dated Nov. 18, 2015.
Office Action in U.S. Appl. No. 14/185,867 dated Nov. 25, 2015.
Office Action for Taiwanese Patent Application No. 104105773 dated Jan. 11, 2016.
Office Action in U.S. Appl. No. 13/667,976 dated May 4, 2016.
Office Action in Japanese Patent Application No. 2014-540158 dated Aug. 2, 2016.
2nd Office Action for Taiwanese Patent Application No. 104105773 dated Jul. 6, 2016.
Office Action in U.S. Appl. No. 13/667,976 dated Aug. 26, 2016.
International Preliminary Report on Patentability in PCT/US2015/016448 dated Sep. 1, 2016.
Decision of Rejection for Taiwanese Patent Application No. 104105773 dated Nov. 7, 2016.

* cited by examiner

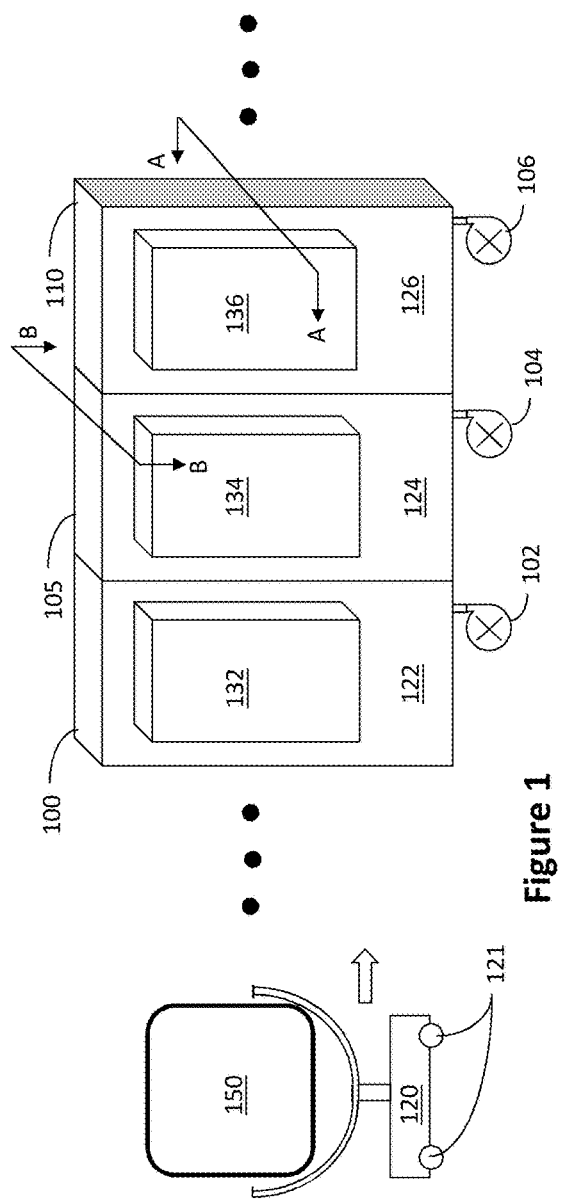
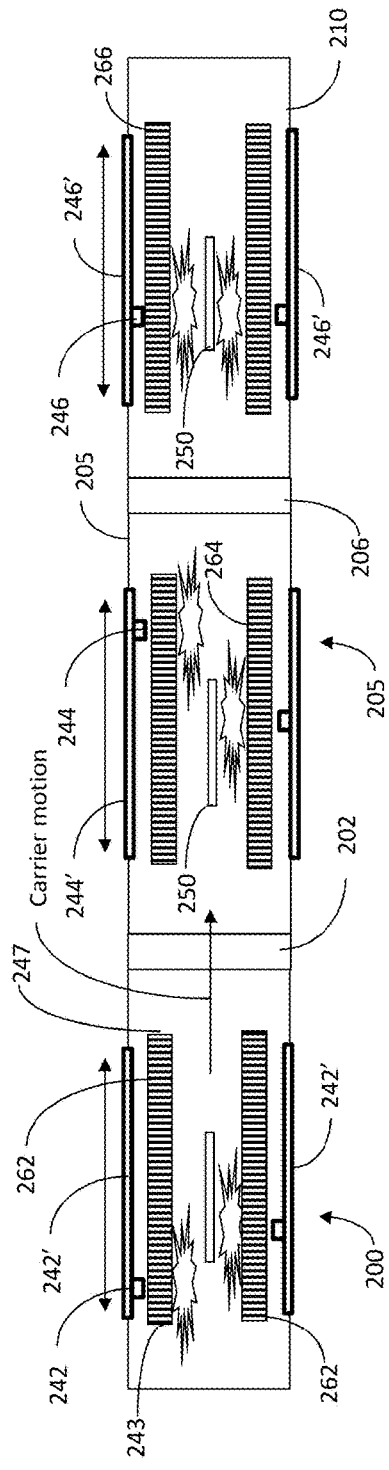

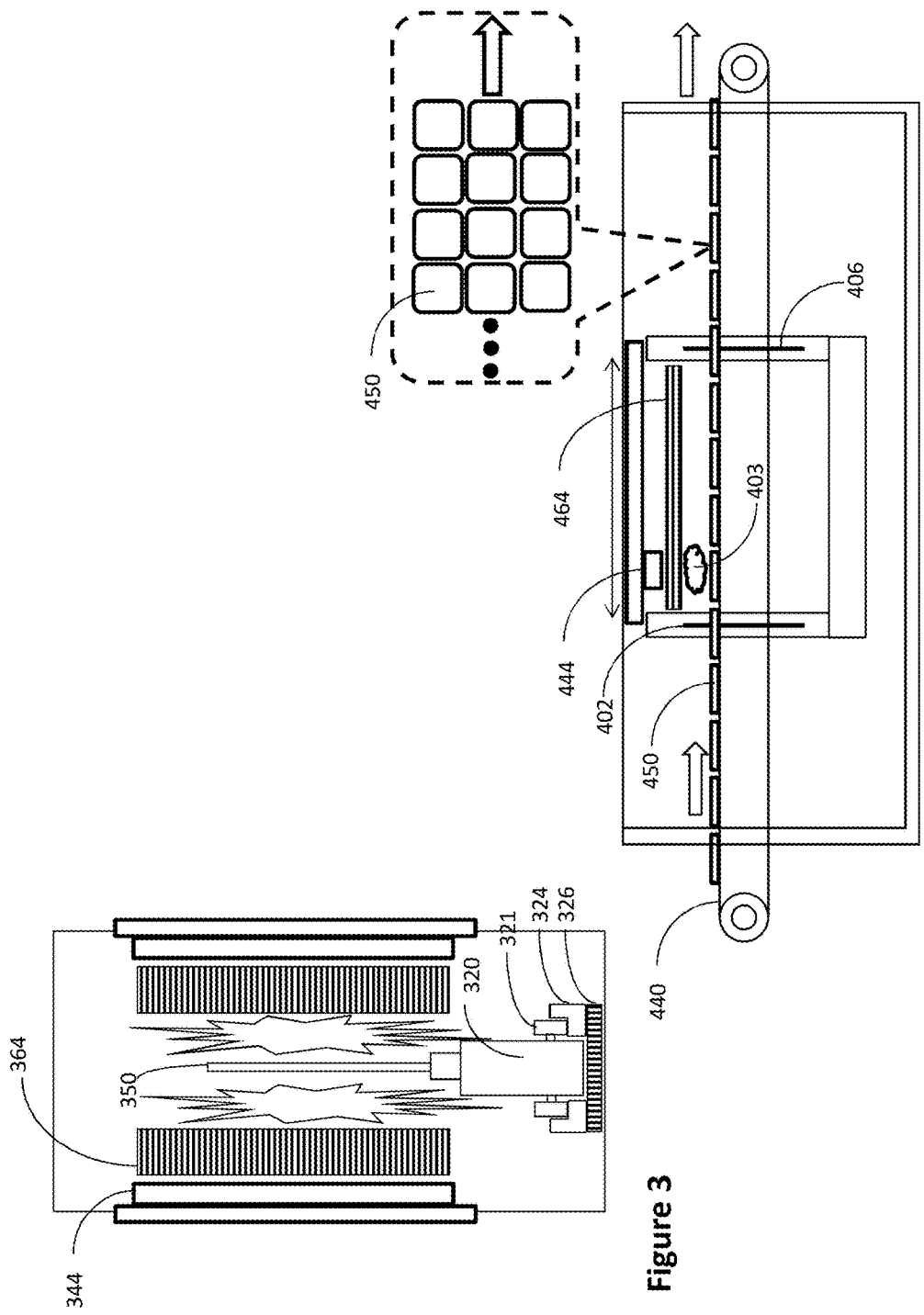

SPUTTERING SYSTEM AND METHOD USING DIRECTION-DEPENDENT SCAN SPEED OR POWER

RELATED APPLICATION

This application is a continuation-in-part of U.S. application Ser. No. 13/667,976, filed on Nov. 2, 2012, entitled "Linear Scanning Sputtering System and Method," which claims priority benefit from U.S. Provisional Application Ser. No. 61/556,154, filed on Nov. 4, 2011, the disclosures of which are incorporated herein by reference in their entirety.

BACKGROUND

1. Field

This application relates to sputtering systems, such as sputtering systems used to deposit thin films on substrates during the fabrication of integrated circuits, solar cells, flat panel displays, etc.

2. Related Arts

Sputtering systems are well known in the art. An example of a sputtering system having a linear scan magnetron is disclosed in U.S. Pat. No. 5,873,989, in which a magnetron sputtering source for depositing a material onto a substrate includes a target from which the material is sputtered, a magnet assembly disposed in proximity to the target for confining a plasma at the surface of the target and a drive assembly for scanning the magnet assembly relative to the target. The sputtering process relies on the creation of a gaseous plasma and then accelerating the ions from this plasma into the target. The source material of the target is eroded by the arriving ions via energy transfer and is ejected in the form of neutral particles—either individual atoms, clusters of atoms or molecules. As these neutral particles are ejected they will travel in a straight line to impact and coat the surface of the substrate as desired.

One of the problems to be resolved in such a system is the uniformity of the film that is formed on the substrate. Another problem to be resolved in such a system is target utilization. Specifically, since the magnets of linear magnetrons scans back and forth, excessive sputtering occurs at both edges of the target, generating two deep grooves along, i.e., parallel to, the scan direction. Consequently, the target has to be replaced, even though the majority of the surface of the target is still usable. Various methods for combating this phenomenon are disclosed in the above cited '989 patent.

However, another target utilization issue that has not been previously addressed is the erosion caused at the edges of the scan cycle. That is, when the magnets reach an end of the target, the scan direction is reversed. In order to achieve film uniformity, the '989 patent suggests to slow the scan speed towards either end of the target. However, this leads to increased sputtering of the target, leading to excessive erosion at both ends of the target in a direction perpendicular to the scan direction.

Accordingly, there is a need in the art for a sputtering system that enables uniform film deposition and increased target utilization.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed herein is a sputtering system and method that enhance uniformity of the film formed on the substrate, and also enables high throughput. One embodiment provides a system wherein substrates continually move in front of the sputtering target. The magnetron is linearly scanned back and forth at speed that is at least several times higher than the speed on the substrates' motion. The magnetron is scanned in the direction of substrate travel and then in the reverse direction, repeatedly. During most of its travel, the magnetron is moved at a constant speed. However, as it approaches the end of its travel, is decelerates. Then, when is starts its travel in the opposite direction, it accelerates until it reaches the constant speed. The deceleration/acceleration in one embodiment is 0.5 g and in another it is 1 g. This enhances utilization of the target. According to another embodiment, the turning point of the magnetron is changed at successive scans, so as to define a zone of turnaround. This also helps in enhancing target utilization.

A sputtering system having a processing chamber with an inlet port and an outlet port, and a sputtering target positioned on a wall of the processing chamber. A movable magnet arrangement is positioned behind the sputtering target and reciprocally slides behinds the target. A conveyor continuously transports substrates at a constant speed past the sputtering target, such that at any given time, several substrates face the target between the leading edge and the trailing edge. The movable magnet arrangement slides at a speed that is at least several times faster than the constant speed of the conveyor. A rotating zone is defined behind the leading edge and trailing edge of the target, wherein the magnet arrangement decelerates when it enters the rotating zone and accelerates as it reverses direction of sliding within the rotating zone.

In accordance with certain embodiments, a system for sputtering material from a target onto a substrate includes a carrier operable to transport the substrate in a downstream direction, and one or more processing chambers, including a first processing chamber, through which the substrate is passed in the downstream direction. The first processing chamber can have a sputtering target, and a magnet operable to scan across the sputtering target in the downstream direction at a downstream scanning speed and in an upstream direction opposite to the downstream direction at an upstream scanning speed that is lower than the downstream scanning speed.

In accordance with certain embodiments, a processing chamber includes a sputtering target, and a magnet operable to scan across the sputtering target in the downstream direction at a downstream scanning speed and in an upstream direction opposite to the downstream direction at an upstream scanning speed that is lower than the downstream scanning speed.

In accordance with certain embodiments, a sputtering method includes transporting a substrate past a sputtering target at a downstream speed, and inducing sputtering of target material onto substrate by scanning a magnet across the sputtering target in the downstream direction at a downstream scanning speed and in an upstream direction opposite to the downstream direction at an upstream scanning speed that is lower than the downstream scanning speed.

In accordance with certain embodiments, a system for sputtering material from a target onto a substrate includes a carrier operable to transport the substrate in a downstream direction, and one or more processing chambers, including a first processing chamber, through which the substrate is passed in the downstream direction. The first processing chamber can have a sputtering target, and a magnet operable to scan across the sputtering target in the downstream direction at a downstream scanning power level and in an upstream direction opposite to the downstream direction at an upstream scanning power level that is greater than the downstream scanning power level.

In accordance with certain embodiments, a processing chamber includes a sputtering target, and a magnet operable to scan across the sputtering target in the downstream direction at a downstream scanning power level and in an upstream direction opposite to the downstream direction at an upstream scanning power level that is greater than the downstream scanning power level.

In accordance with certain embodiments, a sputtering method includes transporting a substrate past a sputtering target at a downstream speed, and inducing sputtering of target material onto substrate by scanning a magnet across the sputtering target in the downstream direction at a downstream scanning power level and in an upstream direction opposite to the downstream direction at an upstream scanning power level that is greater than the downstream scanning power level.

According to further aspects of the invention, a sputtering arrangement for a deposition chamber is provided, comprising a target having a front surface and a back surface, and having sputtering material provided on its front surface; A movable magnet mechanism having a magnet configured for reciprocally scanning in close proximity to the back surface of the target and a counterweight configured for reciprocally scanning at same speed but opposite direction as the magnet. By having the counterweight move at the same speed but opposite direction of the mag, vibrations and loads on the system are reduced, and the magnet can be scanned at much higher speeds and be accelerated and decelerated at much higher rates. The movable magnet mechanism includes a motive element which is energize to reciprocally move the target and the counterweight, wherein the magnet and the counterweight are mechanically coupled to the motive element. The motive element may be a deformable tension element, examples of which include belt, a timing belt, a chain, etc. A motor is coupled to the motive element to energize the motive element, and a controller provides signals to activate the motor.

According to another aspects, method for operating a sputtering system and a controller for operating sputtering system are provided wherein the is controller operable to repeatedly scan the magnetic pole according to: repeatedly scan at upstream direction a distance X, then reverse and scan at downstream a distance Y; when reaching the edge of the target, repeatedly scan at downstream direction a distance X, then reverse and scan at upstream a distance Y; wherein X is longer than Y, and wherein X is shorter than the length of the target. In one embodiment at least one of X and Y is a constant or the distance |X|−|Y| remains constant.

The above features and aspects can be "mixed and matched" in any designed system to thereby obtain desired benefits. A specific system may include all of the above features and aspects to gain maximum benefit, while another system may implement only one or two of the features— depending on the particular situation or application of the system.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 illustrates part of a system for processing substrate using sputtering magnetron according to one embodiment.

FIG. 2 illustrates a cross section along lines A-A in FIG. 1.

FIG. 3 illustrates a cross section along lines B-B in FIG. 1.

FIG. 4A illustrates another embodiment, wherein substrates are supported on a conveyor that moves continuously at constant speed, while

DETAILED DESCRIPTION

Figure 4B:
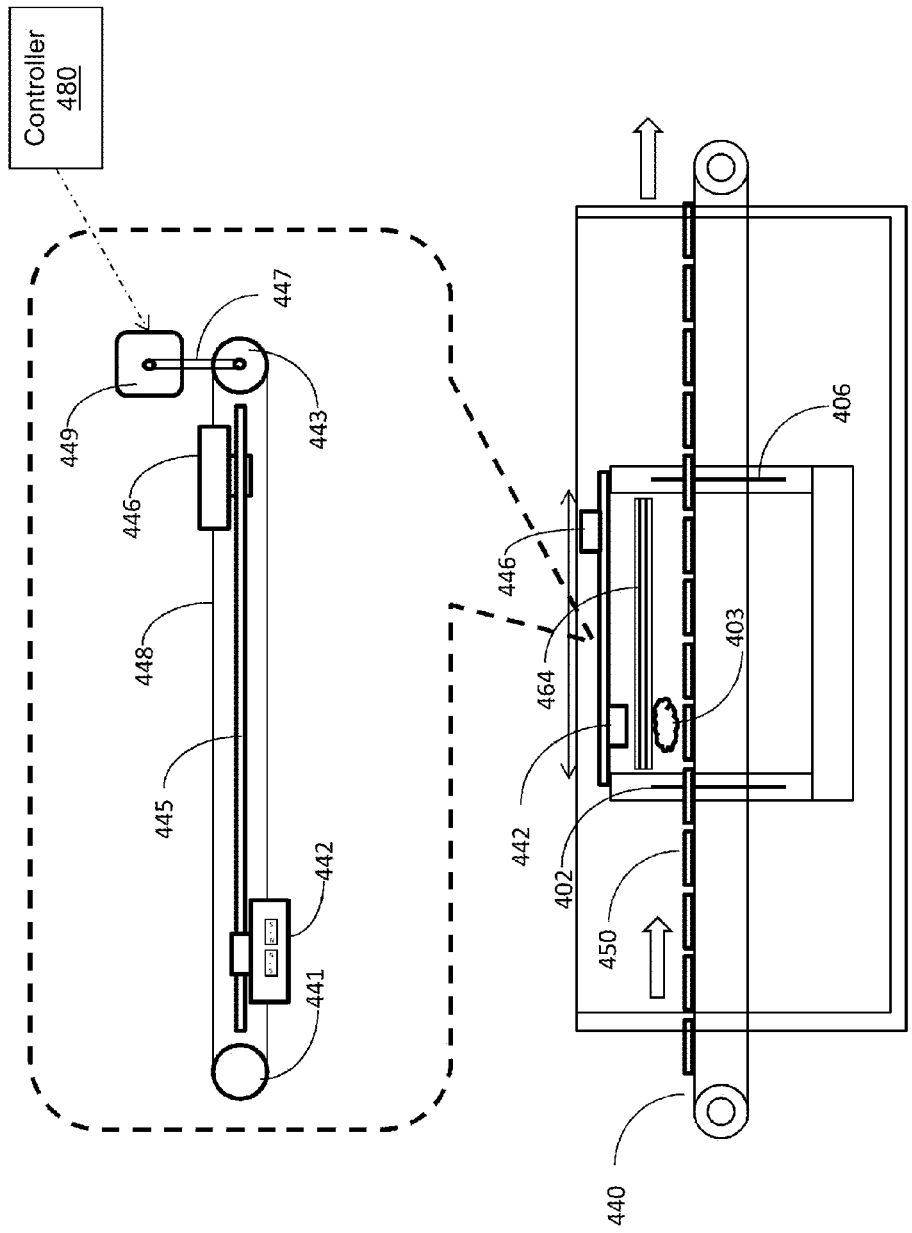
FIG. 4B illustrates another embodiment wherein a counter-weight is used to balance the motion of the scanning magnetic pole.

Embodiments of the inventive sputtering system will now be described with reference to the drawings. Different embodiments may be used for processing different substrates or to achieve different benefits, such as throughput, film uniformity, target utilization, etc. Depending on the outcome sought to be achieved, different features disclosed herein may be utilized partially or to their fullest, alone or in combination, balancing advantages with requirements and constraints. Therefore, certain benefits will be highlighted with reference to different embodiments, but are not limited to the disclosed embodiments.

FIG. 1 illustrates part of a system for processing substrates using sputtering magnetron, according to one embodiment. In FIG. 1, three chambers, 100, 105 and 110, are shown, but the three dots on each side indicate that any number of chambers may be used. Also, while here three specific chambers are shown, it is not necessary that the chamber arrangement shown here would be employed. Rather, other chamber arrangements may be used and other type of chambers may be interposed between the chambers as shown. For example, the first chamber, 100, may be a loadlock, the second, 105, a sputtering chamber, and the third, 110 another loadlock.

For illustration purposes, in the example of FIG. 1, the three chambers 100, 105 and 110 are sputtering chambers; each evacuated by its own vacuum pump 102, 104, 106.

Each of the processing chambers has a transfer section, 122, 124 and 126, and a processing section 132, 134 and 136. Substrate 150 is mounted onto a substrate carrier 120. In this embodiment, the substrate 150 is held by its periphery, i.e., without touching any of its surfaces, as both surfaces are fabricated by sputtering target material on both sides of the substrate. The carrier 120 has a set of wheels 121 that ride on tracks (not shown in FIG. 1). In one embodiment, the wheels are magnetized so as to provide better traction and stability. The carrier 120 rides on rails provided in the transfer sections so as to position the substrate in the processing section. In one embodiment, motive force is provided externally to the carrier 120 using linear motor arrangement (not shown in FIG. 1). When the three chambers 100, 105, and 110, are sputtering chambers, it is assumed that the carrier 120 enters and exits the system via a loadlock arrangement.

FIG. 2 illustrates a cross section along lines A-A in FIG. 1. For simplicity, in FIG. 2 substrate 250 is illustrated without its carrier, but it should be appreciated that the substrate 250 remains on the substrate carrier 120 throughout the processing performed in the system of FIG. 1, and is continuously transported from chamber to chamber by the substrate carrier, as illustrated by the arrow in FIG. 2. In this illustrative embodiment, in each chamber, 200, 205 and 210, the substrate 250 is processed on both sides. Also shown in FIG. 2 are isolation valves 202, 206, that isolate each chamber during fabrication; however, since in one embodiment the substrates continuously move, the isolation valves can be replaced with simple gates or eliminated.

Each chamber includes a movable magnetron 242, 244, 246, mounted onto a linear track 242', 244', 246', such that it scans the plasma over the surface of the target 262, as shown by the double-headed arrows. The magnets are scanned back and forth continuously as the substrates are transported in the chambers on the carriers in a downstream direction. As illustrated with respect to magnets 242, as the magnets reach the leading edge 243 of the target 262, it reverses direction and travels towards the trailing edge 247 of target 262. When it reaches the trailing edge 247, it again reverses direction and is scanned towards the leading edge 243. This scanning process is repeated continuously. Note that in this particular example the downstream direction is aligned parallel to the target 262 from its leading edge 243 to its trailing edge 247. Also, as described herein, the leading edge may also be referred to as the upstream location or region, while the trailing edge may also be referred to as the downstream location or region. Upstream and downstream in this respect are therefore defined with reference to the direction of travel of the substrate, which reaches upstream leading edge 243 before it reaches downstream trailing edge 247 in its travel past the target 262.

FIG. 3 illustrates a cross section along lines B-B in FIG. 1. Substrate 350 is shown mounted onto carrier 320. Carrier 320 has wheels 321, which ride on tracks 324. The wheels 321 may be magnetic, in which case the tracks 324 may be made of paramagnetic material. In this embodiment the carrier is moved by linear motor 326, although other motive forces and/or arrangements may be used. The chamber is evacuated and precursor gas, e.g., argon, is supplied into the chamber to maintain plasma. Plasma is ignited and maintained by applying RF bias energy to the movable magnetron 344, situated behind target 364.

FIG. 4A illustrates another embodiment, wherein substrates 450 are supported on a conveyor 440 that moves continuously for "pass-by" processing, with an arrangement to pass through gates 402 and 406. This arrangement is particularly beneficial when only one side of the substrates needs to be sputtered, such as when fabricating solar cells. For example, several substrates can be positioned abreast such that several substrates are processed simultaneously. The callout in FIG. 4A illustrates three substrates abreast, i.e., arranged along a line perpendicular to the direction of motion, as indicated by the arrow. The substrates may be said to be arranged in multiple rows and columns. The dots in the callout indicate that the supply of substrates, in the column direction, may be "endless," as their number is constantly replenished on the conveyer. Thus the substrates are arranged in an "endless" supply or row direction and in n rows, wherein n in the example of FIG. 4A is 3, although n may be any integer. Further, in such an embodiment, when the target 464 is longer relative to the size of the substrates, then several substrates can be processed simultaneously in columns and rows as the belt continuously moves the substrates under the target 464. For example, when using three rows, i.e., three wafers abreast, the size of the target can be designed so as to enable processing of four substrates in three rows, thus simultaneously processing twelve substrates. As before, the magnetron 444 moves back and forth linearly between the leading and trailing edges of the target, in a direction parallel to the direction of travel of the substrates, as shown by the double-headed arrow. The plasma 403 follows the travel of the magnetron 444 in the opposite side of target 464, to thereby sputter material from target 464 onto the substrates 450.

FIG. 4B illustrates another embodiment having a scanned magnetic pole 442 and counterweight 446. Specifically, the magnetic pole 442 is scanned linearly back and forth, as shown by the double-headed arrow. At either end the scanning has to reverse direction. This reverse of direction can cause vibration in the system and may limit the deceleration and acceleration speeds. To reduce this effect, counterweight 446 is provided as a counter balance, and is scanned in the opposite direction to counter the motion of the magnetic pole. This reduces vibrations in the system and allows for fast deceleration and acceleration of the magnetic pole.

In the particular example of FIG. 4B, the magnetic pole 442 and the counterweight 446 are slidably coupled to a linear track assembly 445, such that the magnetic pole 442 and the counterweight 446 are free to slide on linear track assembly 445. From the point of view of the drawing of FIG. 4B, the linear track assembly is seen as a single track, but it may be several tracks arranged to support the magnetic pole 442 and counterweight 446 to freely move linearly back and forth. The magnetic pole 442 is attached to one side of motive element 448, while the counterweight 446 is attached to the other side of the motive element 448. The motive element 448 may be a conveyer such as a chain, a belt, toothed (timing) belt, etc., rotating over wheels 441 and 443. One of the wheels, e.g., wheel 443 is energized by motor 449 via coupling mechanism 447, e.g., a toothed belt. The motor 449 is controlled by controller 480, which sends signals to the motor 449 to rotate wheel 443 back and forth, such that the conveyor 448 slides the magnetic pole 442 back and forth on track 442, while sliding the counterweight 446 in the opposite direction. That is, the counterweight moves at the same speed but opposite direction of the magnet. This arrangement drastically reduces the loads on the motor and the system in general. It also reduces vibration and enables high speeds and high accelerations and decelerations.

Figure 5:
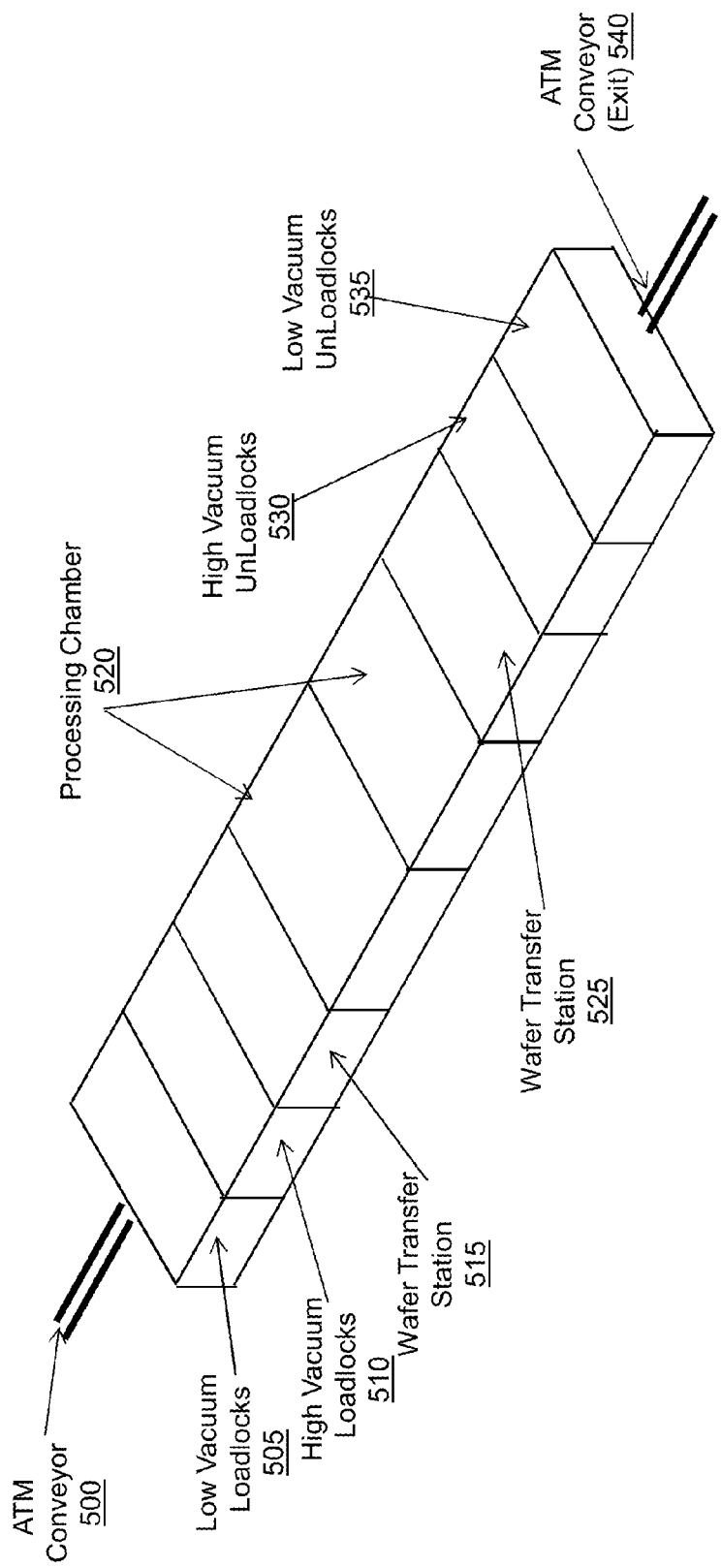
FIG. 5 illustrates an example of a system architecture using a sputtering chamber such as that shown in FIGS. 4A and 4B.

FIG. 5 illustrates an example of a system such as that shown in FIG. 4A or 4B. An atmospheric conveyor 500 continuously brings substrates into the system, and the substrates are then transported on conveyors inside the system so as to traverse a low vacuum loadlock 505, a high vacuum loadlock 510, and, optionally, a transfer chamber 515. Then the substrates, while continuously moving on the conveyor, are processed by one or more successive chambers 520, here two are shown. The substrates then continue on conveyors to an optional transfer chamber 525, then to high vacuum loadlock 530, low vacuum loadlock 535, and then to atmospheric conveyor 540, to exit the system.

Figure 6:
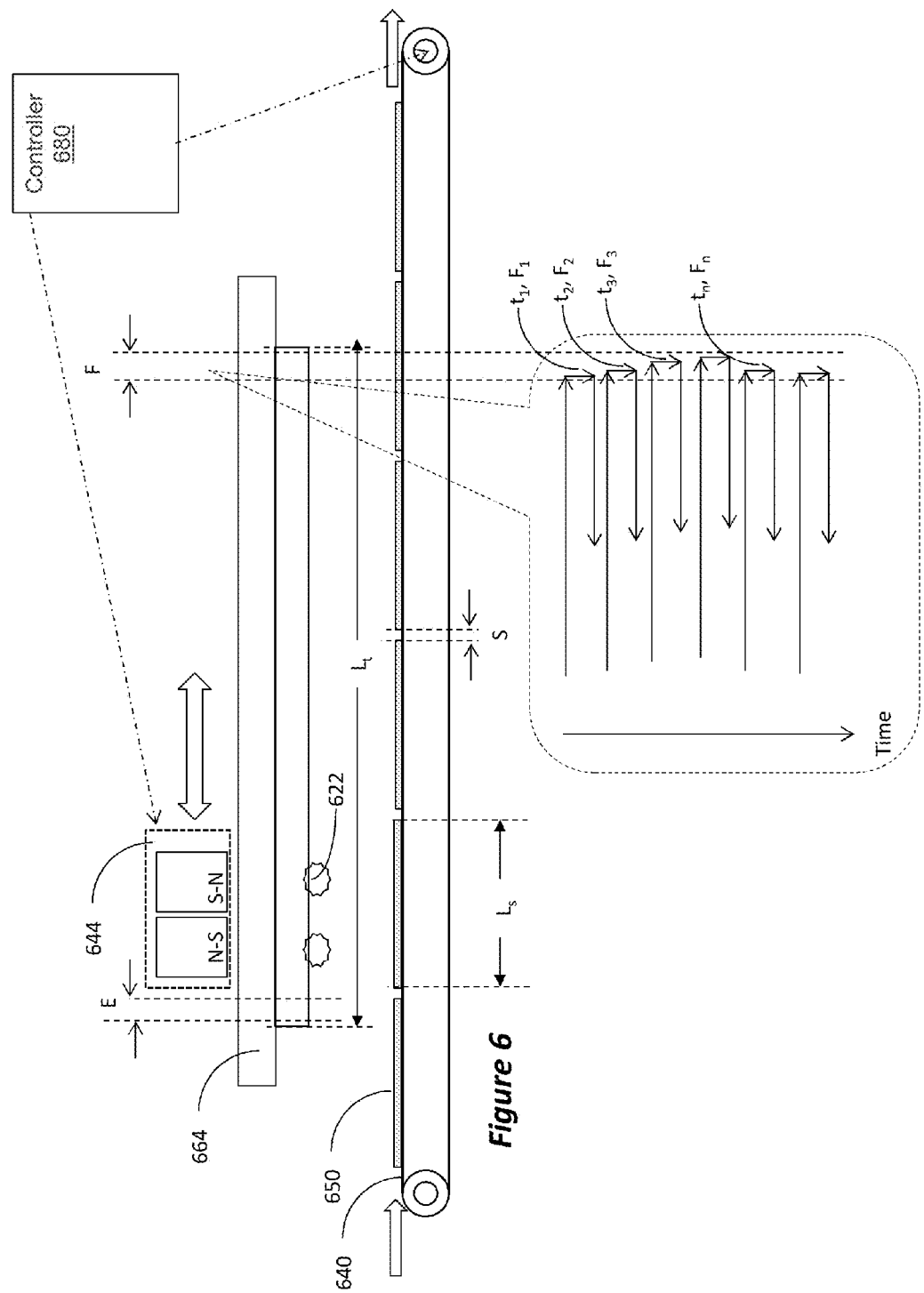
FIG. 6 illustrates an embodiment of a movable magnetic pole, which may be used in any of the disclosed embodiments.

FIG. 6 illustrates an embodiment of the movable magnetron, which may be used in any of the above embodiments. In FIG. 6, the substrates 650 are moved on the conveyor 640 at constant speed. The target assembly 664 is positioned above the substrates, and movable magnetron 644 oscillates back and forth linearly behind the target assembly, as shown by the double-headed arrow. The plasma 622 follows the magnetron, causing sputtering from different areas of the target. In this embodiment, during normal travel the speed of the magnetron is constant and is at least several times the speed of the substrates. The speed is calculated such that during the time a substrate traverses the sputtering chamber, it is sputtered several times by the moving magnetron. For example, the speed of the magnetron can be five to ten times faster than the speed of the substrate, such that by the time the conveyor moves the substrate past the entire length of the target, the magnets have been scanned back and forth several times behind the target so as to deposit multiple layers on the substrate.

As shown in FIG. 6, in this embodiment each substrate is of length Ls, which is defined in the direction of travel of the conveyor belt. Similarly, the target has a length Lt, which is defined in the direction of travel of the conveyor, which is parallel with the direction of travel of the magnets. In this embodiment, the target's length, Lt, is several times longer than the substrate length Ls. For example, the target length can be four times longer than the pitch length, which is defined as one substrate length plus the length of separation S between two substrates on the conveyor. That is, the pitch P=(Ls+S).

The problem with linear motion of magnetron behind a target is that when it reaches the leading or trailing end of the target, it stops and starts motion in the reverse direction. Consequently, the edges of the target get eroded much more than the main surface of the target. When the erosion at the edges of the target exceeds specification, the target needs to be replaced, even though the center of the target is still usable. This problem is addressed using various embodiments, as described below.

According to one embodiment, offsets E and F are designated at the leading and trailing edges of the target, respectively. When the magnetron reaches the offset, it decelerates at a prescribed rate, e.g., 0.5 g, 1 g, etc. At the end of the offset the magnetron changes direction and accelerates at the prescribed rate. This is done at both ends of travel of the magnetron, i.e., at the leading and trailing edges of the target.

According to another embodiment, a rotation zone is prescribed, e.g., zones E and F are designated at the leading and trailing edges of the target, respectively. When the magnetron reaches either of the rotation zones, it changes travel direction at a point within the rotating zone. However, over time the magnetron changes direction at different points within the rotating zone. This is exemplified by the callout in FIG. 6. As illustrated, at time $t_1$ the point of reversing direction is designated as $F_1$. At time $t_2$, the point of reversing direction is designated $F_2$, and is further towards the trailing edge of the target as point $F_1$, but is still within the zone designated F. At time $t_3$, the point of reversing direction $F_3$ is even further towards the trailing edge of the target, while at time $t_n$, point $F_n$ is back away from the trailing edge of the target. However, all points $F_i$ are within the zone F. A similar process takes place over zone E on the other side, i.e., the leading edge of the target.

The selection of the points of reversing scan direction can be done using various ways. For example, a random selection can be done at each scan, at each two scans, or after x number of scans. Conversely, a program can be implemented wherein at each scan the point is moved a distance Y in one direction until the end of the zone is reached, and then the points start to move a distance Y towards the opposite end. On the other hand, the movement can be designed to generate an interlaced pattern by moving in one direction a Z amount and then in the next step moving in the reverse direction a −w amount, wherein $|w|<|Z|$.

In the embodiments described herein, over the processing regime the magnetron is scanned at constant speed, as it has been found that varying the can speed adversely affects film uniformity on the substrates. Notably, in configurations where the substrates continuously moves in front of the target, slowing down or speeding up the magnet array over the processing area is inadvisable, even for controlling the film thickness uniformity.

In the disclosed embodiments, moving many substrates on a conveyor can be thought of as a continuous (infinitely long) substrate that is moving at a constant speed. The scan speed must be selected so as to give good uniformity on a substrate moving at a constant speed. In these embodiments, special use is made of the start position, the stop position, acceleration, and deceleration to control target utilization. This has the effect of spreading out the deep grooves that occur at the ends when reversing the motion.

A pole design is used to reduce the deep grooves at the top and bottom of the plasma track. A thicker target can be used or higher power can be utilized into the targets because the scan is done at a fairly high speed, spreading the power out over the full surface of the substrate. Because each substrate sees multiple target passes of the plasma, the start and stop position can be varied with each pass and the effect of changing the scan length from one pass to the next will not be seen in the film uniformity. That is, while the embodiment of FIG. 6 was described such that the rotating zone is designed to be outside of the processing area, this is not necessary when having the substrates continuously move, as described herein. Rather, the rotating zone can be within the processing area.

For example, according to one embodiment the system is used to fabricate solar cells at a rate of 2400 substrates per hour. The conveyor continuously moves the substrates at a rate of about 35 mm/sec. The magnetron is scanned at a speed of at least 250 mm/sec, i.e., more than seven times the speed of the substrate transport. The target and magnetron are designed such that the stroke of the magnetron scan is about 260 mm. This provides film uniformity of over 97%. The acceleration/deceleration can be set at 0.5 g with a distance of about 6.4 mm or 1 g, for about half that distance. As illustrated in FIG. 6, the various calculations and the control of magnetron scan speed, magnetron power, substrate travel speed (e.g., conveyor speed), etc., can be done by one or more controllers 680.

Figure 7A:
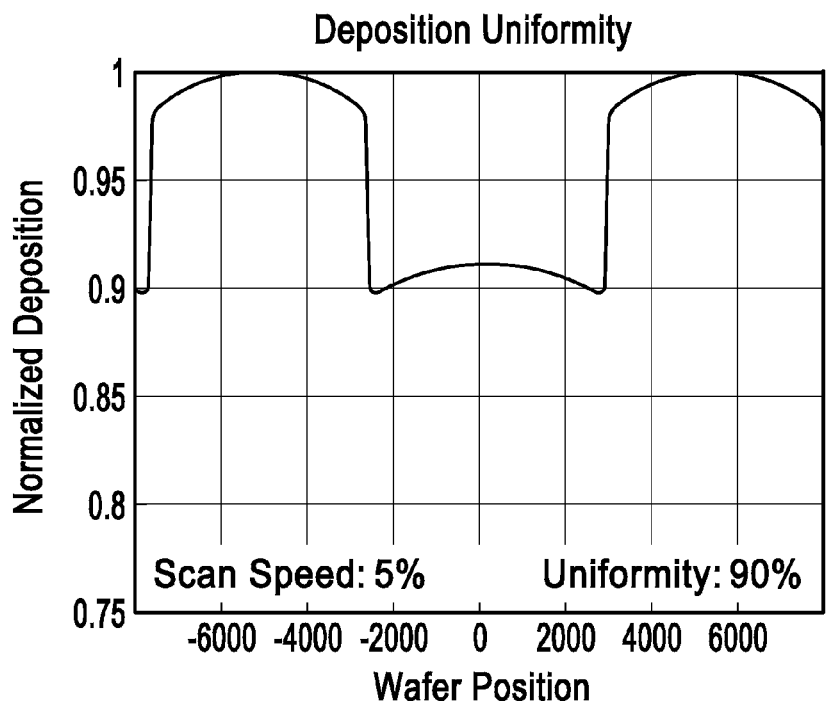
FIGS. 7A-7D are plots of deposition uniformity using constant wafer transport speed and different magnets scan speed.
Figure 7B:
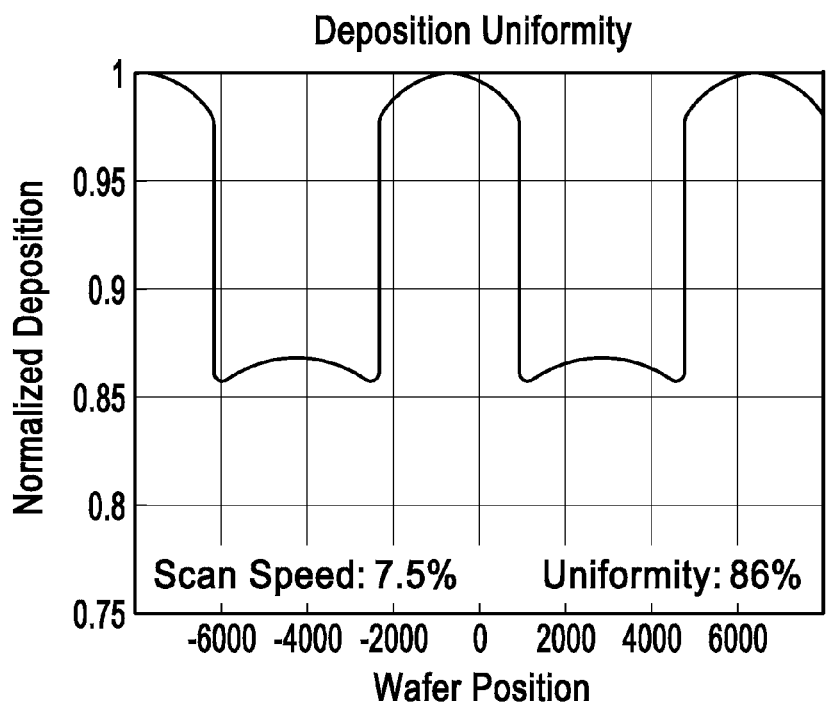
Figure 7C:
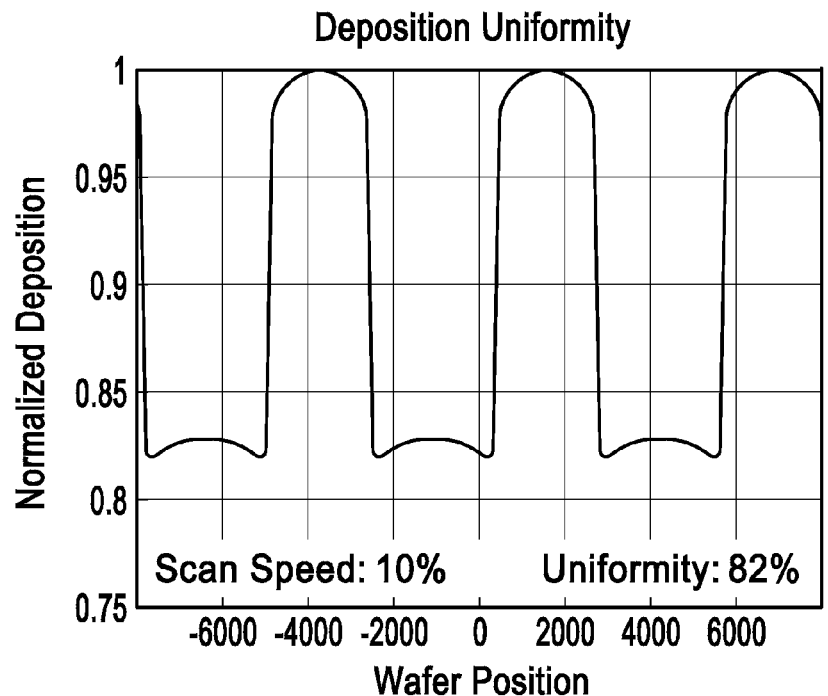
Figure 7D:
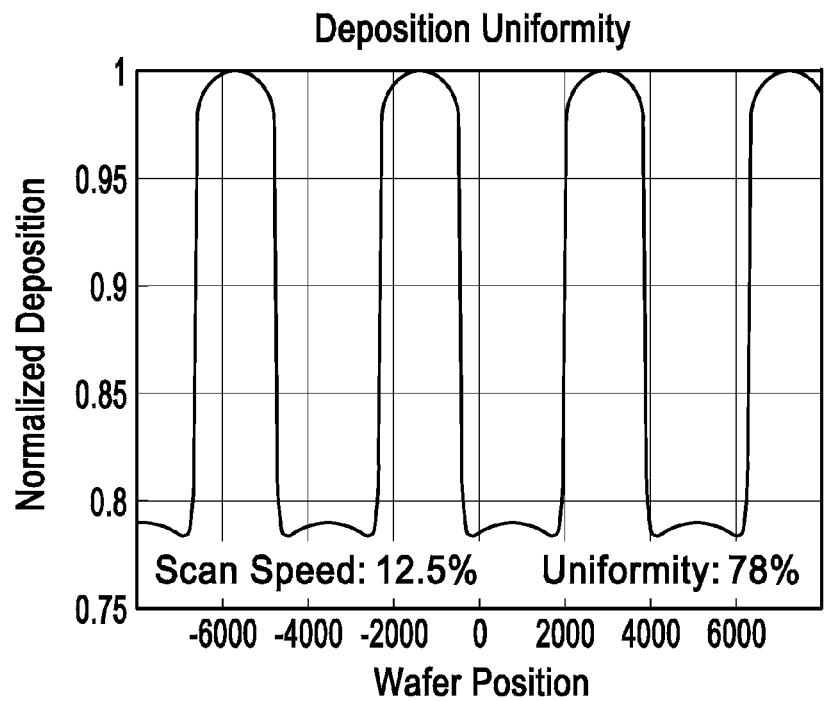

FIGS. 7A-7D are plots of deposition uniformity using constant wafer transport speed and different magnets scan speed. FIG. 7A is a plot of uniformity for magnets scan speed that is 5% of the wafer transport speed. For example, for a wafer transport speed of 35 mm/s, the magnets were scan at 1.75 mm/s. The resulting film uniformity was 90%, which is not adequate for production of devices such as solar cells. When the magnet scan speed was increased to 7.5% of the wafer speed, the uniformity dropped to 86%, as shown in FIG. 7B. Moreover, as the speed was increased to 10% the uniformity dropped to 82%, and when the speed was increased to 12.5% the uniformity dropped even further to 78%. Thus, it appeared that increasing the magnet scan speed causes a corresponding reduction of film uniformity, suggesting that the magnet scan speed should be a small fraction of the wafer transport speed. This conclusion was further supported by the plot shown in FIG. 8A, wherein uniformity drops as the magnet scan speed increases.

Figure 8A:
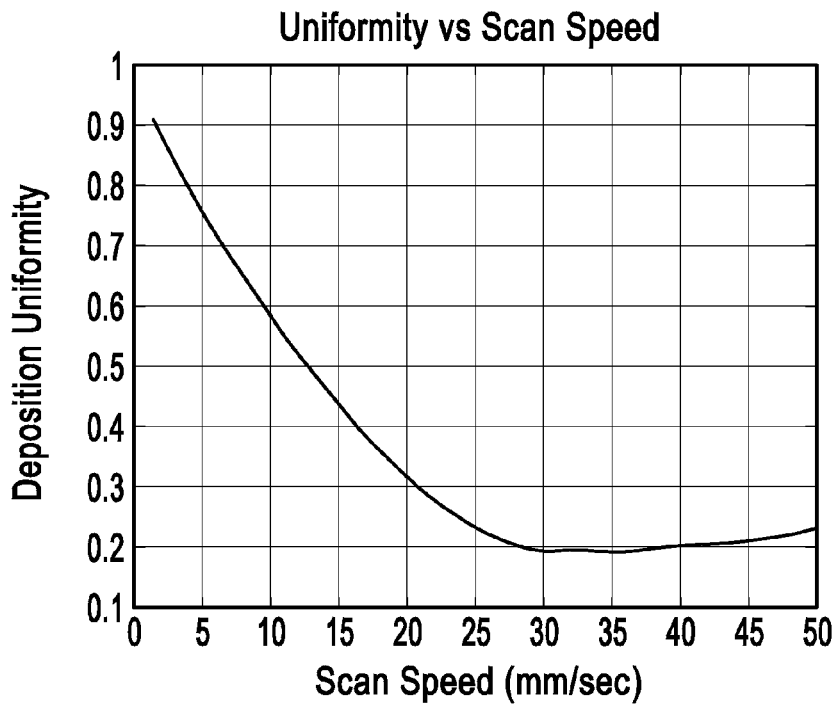
FIG. 8A is a plot illustrating that the uniformity drops as the magnet scan speed increases.
Figure 8B:
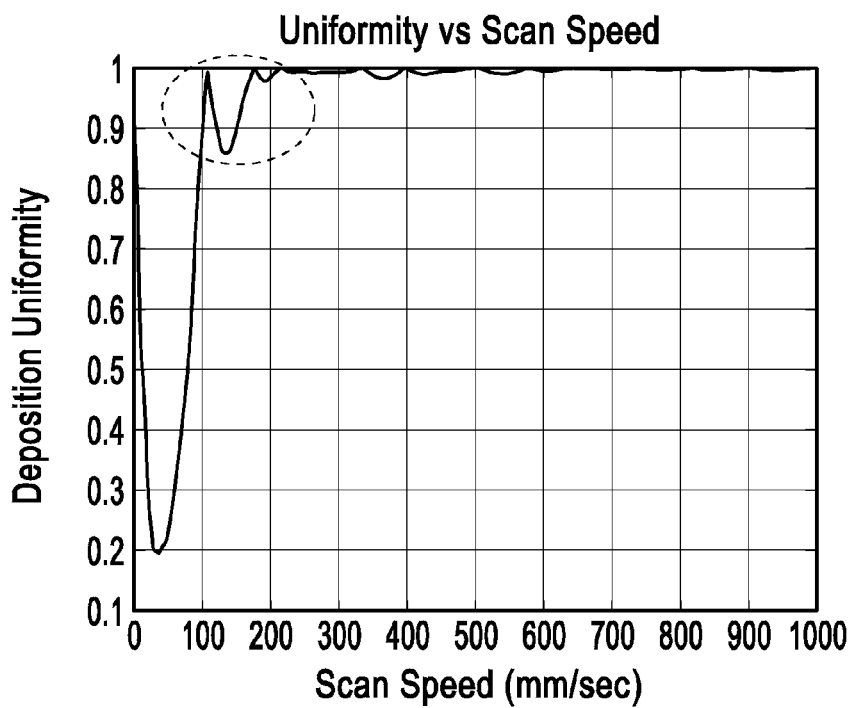
FIG. 8B is another plot illustrating a strange behavior of film deposition uniformity versus magnet scan speed at higher speed than the scan speed.
Figure 8C:
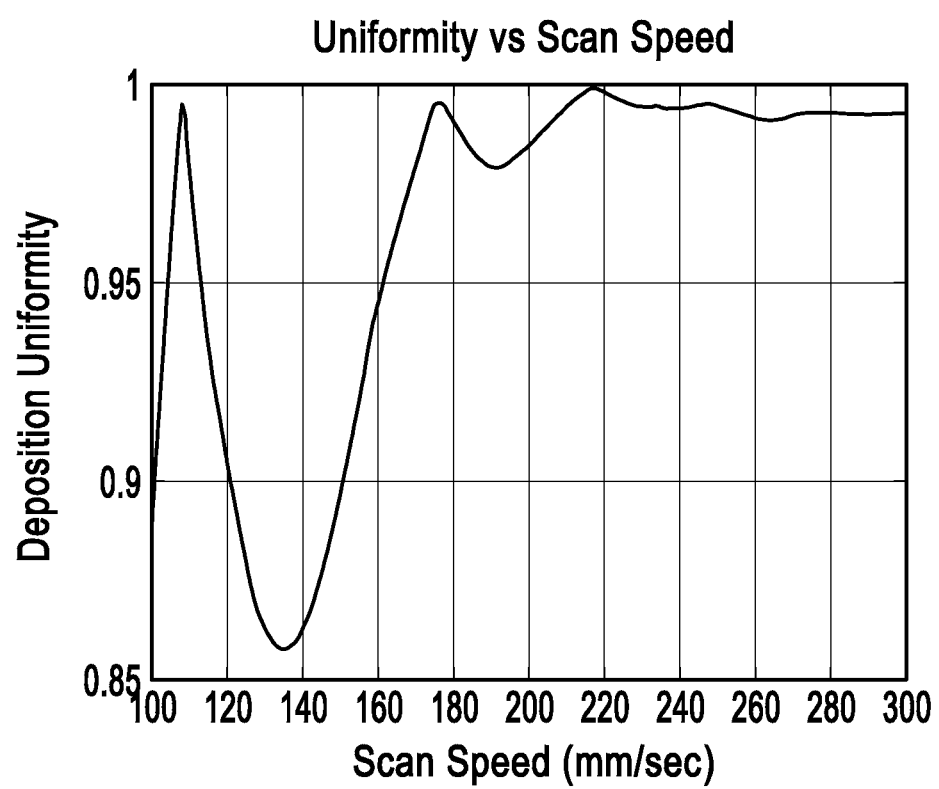
FIG. 8C is an enlargement of the portion circled in FIG. 8B.

However, the plot of FIG. 8A also shows that the maximum achievable uniformity may be about 90% or so. As noted above, such uniformity is not acceptable for many processes. Therefore, further investigation was undertaken, resulting in the plot of FIG. 8B. The plot of FIG. 8B illustrates a strange behavior of film deposition uniformity versus magnet scan speed. Indeed, as magnet scan speed increases, film uniformity drops. However, at a certain point, as the magnet scan speed increases further, uniformity suddenly starts to improve, such that at about magnet scan speed that is three times the wafer transport speed, a uniformity peak of about 98% is achieved. Thereafter a short drop in uniformity is observed, but then uniformity is recovered and remains high when the magnet scan speed that is about 5 times the wafer transport speed and beyond, which is illustrated in the plot of FIG. 8C. As shown in FIG. 8C, which is an enlargement of the portion circled in FIG. 8B, at speeds beyond 5 times the wafer transport speed, the uniformity remains above 97% and, at speeds of about 10 times the transport speed the uniformity remains at over 98%. Higher speeds are not recommended from the mechanical load and machine design perspective, and the uniformity does not seem to improve that much for higher speeds. Thus, the cost in design complexity and potential higher maintenance may not warrant going to scan speeds beyond 10 times the wafer transport speed.

In certain embodiments, scan speed can be different depending on the direction of magnet travel. For example, when the magnet is scanning the target in the downstream direction (i.e., the same direction as the substrate motion), it can be moved at a constant speed that is faster than when it is scanning the target in the upstream direction (i.e., the opposite direction as the substrate motion). Such speed variation can provide better control of deposition rate, and improved deposition uniformity. In certain embodiments, this speed variation can be used to balance the length of time the magnet spends in the downstream and upstream passes across the substrate. That is, the speed of the magnet scan can be chosen such that the "relative" speed, i.e., the speed of the magnet's travel with respect to the target, is the same in both travel direction. For example, if the speed of the substrate is Ss and the relative speed of the magnet is St, then when the magnet travels in the downstream direction it should be scanned at speed St+Ss, while when it travels in the upstream direction, it should be scanned at speed St−Ss.

In addition, in certain embodiments, the magnetron power can be varied depending on the direction of magnet travel. For example, when the magnet is scanning the target in the downstream direction, less or more power can be applied than when it is scanning the target in the upstream direction. Such power variation can provide better control of deposition rate, and improve deposition uniformity. In certain embodiments, this power variation can be used to balance the amount of power that is applied to the magnet in the downstream and upstream passes across the substrate.

In certain embodiments, variations in both speed and power can be used in combination, as a function of the direction of magnet scan. That is, as explained above, in order to generate constant relative scanning speed, when the magnet travels downstream it scans faster than when it travels upstream. This means that in the downstream direction the magnet spends less time over a given target area than when it travels upstream. Therefore, according to one embodiment the magnetron power is varied during the downstream and/or upstream travel such that the total amount of power delivered to the target during the entire downstream scan equals the total amount of power delivered during the upstream scan. Thus, if the total power delivered during one scan direction is Pd and the time it takes for one scan direction (either way) is $t_s$, then the power applied to the magnetron in each direction is calculated as $W=Pd/t_s$, wherein $t_s$ is calculated by the length of the target Lt times scan speed St+Ss or St−Ss depending on the travel direction.

On the other hand, in the case where, for example, the upstream and the downstream speed of the magnet is constant, or is such that during upstream scan the time that a substrate is exposed to the magnet scan is shorter than during the downstream scan, it may be beneficial to increase the power during the upstream scan compared to the power level during the downstream scan. That is, if the time that the substrate is exposed to the sputtering from the target is shorter during upstream travel of the magnet, then the sputtering power should be increased during upstream travel so that more material is deposited on the substrate per unit time. The power difference can be calculated such that the amount of material deposited on the substrate per unit time is the same when the magnet is scanned in either upstream or downstream direction. That is, the power during the upstream and the downstream scanning of the magnet can be adjusted such that while the material sputtered from the target per unit of time is different during upstream and downstream travel of the magnet, the amount of material deposited on the substrate per unit of time is the same. For example, during upstream travel of the magnet the sputtering power may be increased such that the amount of material sputtered from the target is higher per unit of time than during downstream scan of the magnet, but the amount of material deposited on the substrate per unit of time is the same during upstream and downstream scanning of the magnet.

Using the above disclosure, a processing chamber may be provided, comprising: a sputtering target configured for passage of a substrate therethrough in a downstream direction; and a magnet operable to scan across the sputtering target in the downstream direction at a downstream scanning power level and in an upstream direction opposite to the downstream direction at an upstream scanning power level that is smaller or greater than the downstream scanning power level. The magnet may reverse directions at rotating zones at opposite ends of the target, and wherein successive reversals at each of the rotating zones occur at different locations. The different locations may be selected randomly. The target may be greater in length than the substrate. Multiple substrates may be disposed at a predetermined pitch and are passed through the processing chamber, and the magnet may have a length at least four times the pitch.

The scanning reversal can be spread over the entire scanning length, rather than be limited to turning zones. For example, the magnet may be scanned a distance of Xmm, and then be reversed and travel for a distance of −Ymm, wherein |X|>|−Y|. The magnet travel is then reversed again and it is scanned for another Xmm and then reversed for another −Ymm. In this manner, the magnet is advanced Xmm and retracted −Ymm, but since the absolute length of X is loner than the absolute length of Y, the scanning is progressed over the entire length of the target. Then, when the magnet reaches the edge of the target, it travels for a distance of −Xmm, i.e., Xmm in a direction opposite the direction travels previously. It is reversed and travels a distance Ymm. This scanning is repeated, such that the magnet scanning reversal spreads over a large area of the target and is not limited to the edges. While in some embodiments X and Y are constants, in other embodiments X and Y may be varied, e.g., according to the condition of the target.

In certain embodiments, the target scan distance may be a total of about 240 mm. The pole starts at an initial location, and scans a fraction of this total distance per scan, for example 100 mm, before making a first direction reversal. The pole then returns not exactly to the initial location, but to an offset location from the initial location. The offset in one example may be 40 mm, for a total return distance of 60 mm. This pattern is then repeated 6 times in this example to cover the total 240 mm. Consequently, the scanning reversal point expands over the entire surface of the target and is not bound to a reversal zone. In certain embodiments, it is performed at high accelerations/decelerations (ca 4-5 g, wherein g=9.80665 meters per second squared) and scan speeds of about 1000 mm/sec, achieving a net speed that is equivalent to a scan speed of 210 mm/sec for a single 240 mm long scan. Of course these values are by way of example and may vary depending on the particular application. This approach allows the start/stop zones to be distributed over a large area, as they migrate in the downstream or upstream direction, enhancing target utilization while maintaining good uniformity of thickness on the substrate. In certain embodiments, achievement of this approach is realized using a controller that is programmed to set the upstream scan speed, the downstream scan speed, start-stop acceleration/deceleration, upstream power, downstream power, power during acceleration, and power during deceleration. Each of these parameters may be controlled and varied individually by the controller to achieve the desired effect.

Also, in certain embodiments the upstream and downstream start and stop locations are at the same distance apart for each successive scan, which is shorter than the total scan distance, so that the start/stop location moves with each successive pass. For example, with respect to FIG. 6, at all points $F_i$, the distance between $F_i$ and $E_i$ remains constant. Also, in the embodiment of FIG. 6 the zones $F_i$ and $E_i$ are shown as limited to the edges of the target. However, as explained in the example of the preceding paragraph, the turning points need not be limited to the edges of the target, but may rather be spread over the entire length of the substrate.

Various features where described herein, such that different embodiments may have one or more features as needed for a particular application. In any of the embodiments, the upstream and downstream scanning speed may be of same or different magnitude. In any of the embodiments, the upstream and downstream start and stop zones the acceleration and decelerations may be of same or different magnitude. Also, in any of the embodiments the upstream and downstream the magnitudes of power applied to the magnetron may be the same or different. In any of the embodiments, the upstream and downstream start and stop location may be the same or different. In any of the embodiments, the upstream and downstream start stop zones locations are the same distance apart, shorter than the total scan distance, so that the start/stop location moves with each successive pass.

Also, a sputtering method is provided comprising: transporting a substrate past a sputtering target in a downstream direction; and inducing sputtering of target material onto substrate by scanning a magnet across the sputtering target in the downstream direction at a downstream scanning power level and in an upstream direction opposite to the downstream direction at an upstream scanning power level that is greater than the downstream scanning power level. The magnet may reverse directions at rotating zones at opposite ends of the target, and wherein successive reversals at each of the rotating zones occur at different locations. The different locations may be selected randomly.

With the above description, a system for depositing material from a target onto a plurality of substrates is provided, comprising: a conveyor operable to transport the plurality of substrates in a downstream direction; and a processing chamber through which the substrates are passed in the downstream direction, the processing chamber having a target having a length parallel to the downstream direction and longer than a combined length of n substrates; and a magnet operable to reciprocally scan across the target. In some embodiments during the scanning in the downstream direction, a downstream scanning power level is applied to the target and during the scanning in the upstream direction opposite to the downstream direction, an upstream scanning power level is applied to the target, and the upstream power may be different from the downstream power level. In other embodiments a counterweight is configured to scan at same speed but opposite direction than the magnet. In yet other embodiments the conveyor delivers n rows of substrates, wherein n is an integer. In further embodiments the magnet reverses scanning direction at different positions along the length of the target, wherein the reversal direction migrates along the length of the target. In further embodiments the downstream scanning speed and the upstream scanning speed are set so as to maintain a constant speed between the magnet and the substrate in either scanning direction.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A system for depositing material from a target onto a substrate, comprising:
   a carrier operable to transport the substrate in a downstream direction; and
   one or more processing chambers, including a deposition chamber, through which the substrate is passed in the downstream direction, the deposition chamber comprising:

a target;
a magnet assembly comprising:
   a magnetic pole;
   a linear track assembly, wherein the magnetic pole is coupled to freely ride on the linear track assembly;
   a counterweight coupled to freely ride on the linear track assembly;
   a conveyor belt having one side coupled to the magnetic pole and another side coupled to the counterweight; and,
   a motor coupled to energize the conveyor belt according to signals from a controller thereby scanning the magnetic pole across the target in the downstream direction at a downstream scanning speed and in an upstream direction opposite to the downstream direction at an upstream scanning speed; and,
a controller programmed to control the motor to energize the conveyor belt at a scanning speed set as a function of scanning direction.

2. The system of claim 1, wherein the controller is programmed to set the upstream scanning speed slower than the downstream scanning speed.

3. The system of claim 1, wherein the controller is programmed to set the downstream scanning speed to be at least five times faster than the speed at which the substrate is passed through the deposition chamber.

4. The system of claim 1, wherein the controller is programmed to set the downstream scanning speed and the upstream scanning speed so as to maintain a constant speed of the magnetic pole relative to the substrate in either scanning direction.

5. The system of claim 1, wherein the controller is programmed to operate a magnetron to apply different power level to the target during a downstream scan of the magnetic pole than during an upstream scan of the magnetic pole.

6. The system of claim 5, wherein the controller is programmed to operate a magnetron such that total power delivered to the target during the entire downstream scan equals total power delivered to the target during the entire upstream scan.

7. The system of claim 1, wherein the controller is programmed to control the motor to energize the conveyor belt so that the magnetic pole reverses directions at rotating zones at opposite ends of the target, and wherein successive reversals at each of the rotating zones occur at different locations.

8. The system of claim 7, wherein the controller is programmed to select the different locations randomly.

9. The system of claim 1, wherein the controller is programmed to repeatedly scan the magnetic pole according to:
   repeatedly scan at upstream direction a distance X, then reverse and scan at downstream a distance Y;
   when reaching the edge of the target, repeatedly scan at downstream direction a distance X, then reverse and scan at upstream a distance Y;
   wherein X is longer than Y, and wherein X is shorter than the length of the target.

10. The system of claim 9, wherein at least one of X and Y is a constant.

11. The system of claim 9, wherein the distance |X|−|Y| remains constant.

12. The system of claim 1, wherein the target is greater in length than the substrate.

13. The system of claim 1, wherein multiple substrates are disposed at a predetermined pitch and are passed through the deposition chamber, said target having a length at least four times said pitch.

* * * * *